United States Patent [19]
Yu

[11] Patent Number: 6,031,405
[45] Date of Patent: Feb. 29, 2000

[54] ESD PROTECTION CIRCUIT IMMUNE TO LATCH-UP DURING NORMAL OPERATION

[75] Inventor: Ta-Lee Yu, Hsinchu Hsien, Taiwan

[73] Assignee: Winbond Electronics Corporation, Hsinchu, Taiwan

[21] Appl. No.: 09/014,186

[22] Filed: Jan. 27, 1998

[30] Foreign Application Priority Data

Oct. 7, 1997 [CN] China ................................ 86114711

[51] Int. Cl.[7] .................................................. H03K 5/08
[52] U.S. Cl. ........................ 327/313; 327/327; 327/439; 361/56
[58] Field of Search .................................... 327/310, 312, 327/313, 321, 327, 324, 439, 465, 478; 361/56, 91

[56] References Cited

U.S. PATENT DOCUMENTS

| | | | |
|---|---|---|---|
| 4,528,462 | 7/1985 | Shackle et al. ........................ | 327/471 |
| 5,294,849 | 3/1994 | Potter ...................................... | 307/647 |
| 5,301,081 | 4/1994 | Podell et al. ............................ | 361/56 |
| 5,473,169 | 12/1995 | Ker et al. ................................ | 257/173 |
| 5,610,425 | 3/1997 | Quigley et al. ........................ | 257/358 |
| 5,625,522 | 4/1997 | Watt ....................................... | 361/111 |
| 5,646,808 | 7/1997 | Nakayama ............................... | 361/56 |
| 5,663,860 | 9/1997 | Swonger ................................. | 361/56 |
| 5,670,799 | 9/1997 | Croft ...................................... | 257/173 |
| 5,757,507 | 5/1998 | Ausschnitt et al. .................... | 356/401 |
| 5,821,572 | 10/1998 | Walker et al. .......................... | 257/107 |
| 5,838,526 | 11/1998 | Ishikawa et al. ....................... | 361/118 |

*Primary Examiner*—Terry D. Cunningham
*Attorney, Agent, or Firm*—Fish & Richardson P.C.

[57] ABSTRACT

An electrostatic discharge protection circuit immune to latch-up during normal operation is disclosed. The ESD protection circuit is positioned at an IC pad for protecting an internal circuit within an integrated circuit from ESD damage. The electrostatic discharge protection circuit comprises a silicon-controlled rectifier and an ON/OFF controller. The silicon-controlled rectifier coupled between the IC pad and a grounding node to form an ESD path, wherein the ON/OFF controller is arranged in the conduction path. During normal operation the ON/OFF controller disconnects the ESD path so as to avoid latch-up even if noise interference happens.

11 Claims, 3 Drawing Sheets

ESD PROTECTION CIRCUIT IMMUNE TO LATCH-UP DURING NORMAL OPERATION

BACKGROUND OF THE INVENTION

1. Field of the Invention

The present invention generally relates to a technique for preventing electrostatic discharge damage to integrated circuits. More particularly, the present invention relates to an electrostatic discharge protection circuit that is immune to latch-up during normal operation.

2. Description of the Prior Art

Electrostatic discharge, ESD hereinafter, is a common phenomenon that occurs during handling of semiconductor integrated circuit ("IC") devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially, or sometimes completely hamper its operation.

There are several ESD stress models based on the reproduction of typical discharge pulses to which the IC may be exposed during manufacturing or handling. Three standards models, known as the Human Body Model (HBM), Machine Model (MM), and Charged Device Model (CDM) have been proposed. The human-body model is set forth in U.S. Military Standard MIL-STD-883, Method 3015.6. The military standard models the electrostatic stress produced on an IC device when a human carrying electrostatic charges touches the lead pins of the IC device. The machine model is set forth in Industry Standard EIAJ-IC-121, which describes the electrostatic stress produced on an IC device when a machine carrying electric charges contacts the lead pins of the IC device. The charged device model describes the ESD current generated when an IC already carrying electric charges is grounded while being handled.

However, in light of the trend toward submicron scale IC fabrication, CMOS IC have become more vulnerable to ESD damage due to advanced processes, such as use of a lightly-doped drain ("LDD") structure and clad silicide diffusions. Therefore, lateral silicon-controlled rectifiers (LSCRs) have been utilized as the main components of ESD protection circuits, for facilitating ESD protection. An example, R. N. Rountree et al., "A PROCESS-TOLERANT INPUT PROTECTION CIRCUIT FOR ADVANCED CMOS PROCESSES," has been proposed in *EOS/ESD Symp. Proc.*, EOS-10, pp.201–205, 1988.

Referring to FIG. 1, a conventional lateral silicon-controlled rectifier fabricated onto a semiconductor substrate is schematically depicted in a cross-sectional view. The silicon-controlled rectifier is arranged at an IC pad 1, which is connected to an internal circuit 2 of the integrated circuit device. When ESD stress occurs at the IC pad 1, latch-up of the silicon-controlled rectifier is triggered to conduct the resulting ESD current and, therefore, bypass the ESD stress. This protects the internal circuit 2 from ESD damage.

As shown in FIG. 1, the silicon-controlled rectifier is fabricated on a P-type silicon substrate 3 in which an N-well region 4 is formed. A P-type well region 5, which might optionally be formed in the P-type silicon substrate 3 adjacent to the N-well region 4, is drawn with dashed lines.

A first P-type doped region 6 formed in the N-well region 3 is connected to the IC pad 1. A first N-type doped region 7 formed in the P-type silicon substrate 3 (or P-well region 5) is spaced from the N-well region 4 and connected to a circuit grounding node $V_{SS}$. Accordingly, the first P-type doped region 6, the N-well region 4, and the P-type silicon substrate 3 (or the P-well region 5), and the first N-type doped region 7 constitute the lateral silicon-controlled rectifier.

In addition, a second N-type doped region 8 is formed in the N-well region 4 as the contact region thereof, and is electrically connected to the first P-type doped region 6 so as to constitute the anode 10 of the silicon-controlled rectifier. A second P-type doped region 9 is 5) formed in the P-type silicon substrate 3 (or P-well region as the contact region thereof, and is electrically connected with the first N-type doped region 7 to constitute the cathode 11 of the silicon-controlled rectifier.

Referring to FIG. 2, the equivalent circuit diagram of the protection circuit shown in FIG. 1 is schematically depicted. In accordance with FIG. 1, the first P-type doped region 6, the N-well region 4, and the P-type silicon substrate 3 (the P-well region 5) serve as the emitter, base, collector, respectively, of a PNP bipolar junction transistor $Q_1$ depicted in FIG. 2. The N-well region 4, the P-type silicon substrate 3 (or P-well region 5), and the first N-type doped region 7 serve as the collector, base, emitter, respectively, of an NPN bipolar junction transistor $Q_2$ as depicted in FIG. 2. The base of the transistor $Q_2$ is tied to the collector of the transistor $Q_2$, and the collector of the transistor $Q_1$ is tied to the base of the transistor $Q_2$, thereby forming the lateral silicon-controlled rectifier. The emitters of the transistors $Q_1$ and $Q_2$ are connected to the IC pad 1 and the circuit grounding node $V_{SS}$, respectively. Moreover, As shown in FIG. 2, two resistors Rn and Rp represent the spreading resistance of the N-well region 4 and the P-type silicon substrate 3 (or P-well region 5), respectively. For simplicity, a block 20 is used to designate the lateral silicon-controlled rectifier depicted in FIG. 2.

When ESD stress occurs at the IC pad 1, latch-up of the silicon-controlled rectifier is triggered to conduct the resulting ESD current and, therefore, bypass the ESD. This protects the internal circuit 2 from ESD damage.

However, during normal operation, latch-up may be abnormally induced and result in disorder or even error if noise interferes with the integrated circuit.

SUMMARY OF THE INVENTION

Therefore, an object of the present invention is to provide an ESD protection circuit; that can prevent the occurrence of latch-up even if noise interference happens during normal operation. Meanwhile, the ESD protection circuit in accordance with the present invention is still capable of ESD immunity.

The present invention achieves the above-indicated objects by providing an electrostatic discharge protection circuit. The ESD protection circuit is positioned at an IC pad for preventing the internal circuitry within an integrated circuit from ESD damage. The electrostatic discharge protection circuit comprises a silicon-controlled rectifier and an ON/OFF controller. The silicon-controlled rectifier coupled between the IC pad and a grounding node to form an ESD path, wherein the ON/OFF controller is arranged in the conduction path. During normal operation, the ON/OFF controller disconnects the ESD path so as to prevent the occurrence of latch-up even if noise interference happens.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
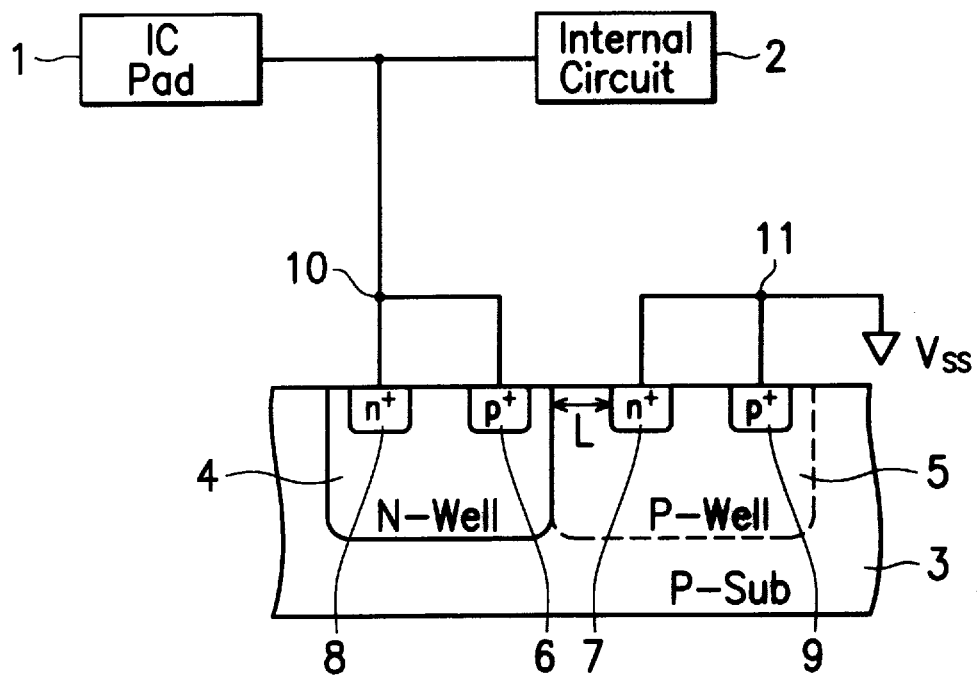
FIG. 1 schematically depicts a conventional lateral silicon-controlled rectifier fabricated onto a silicon substrate in a cross-sectional view.
Figure 2:
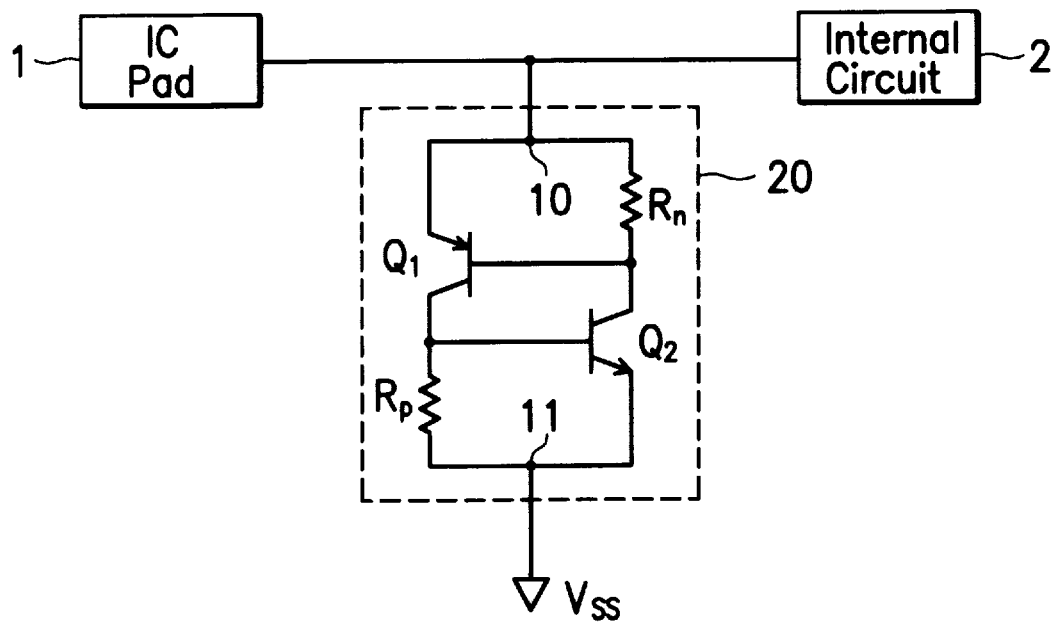
FIG. 2 schematically depicts the equivalent circuit diagram of FIG. 1.
Figure 3:
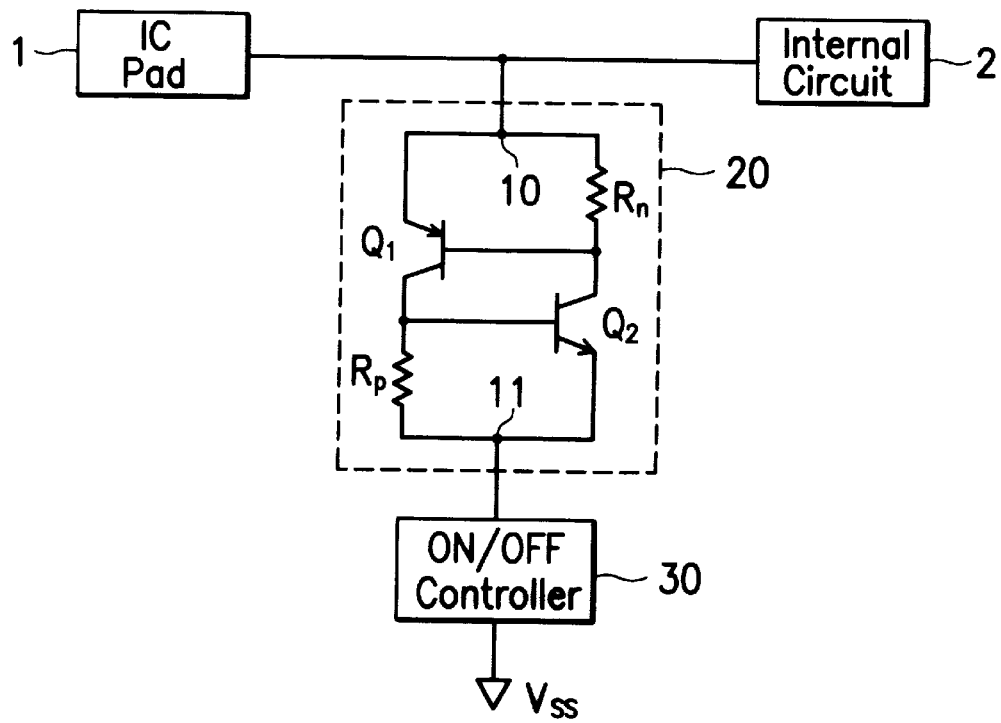
FIG. 3 schematically depicts the circuit diagram of one preferred embodiment in accordance with the present invention.

Referring to FIG. 3, the circuit diagram of one preferred embodiment in accordance with the present invention is schematically illustrated. According to the present invention, the ESD protection circuit is positioned at an IC pad 1, which is electrically coupled to an internal circuit 2, namely, the core circuit of the integrated circuit device. The internal circuit 2 comprises a plurality of metal-oxide-semiconductor field-effect transistors (MOSFETs) having gate oxide susceptible to ESD damage. The protection circuit in accordance with the present invention is primarily utilized to prevent the gate oxide from ESD damage, by means of conducting the ESD current to ground and, therefore, alleviating the ESD stress.

According to the present invention, the protection circuit comprises a silicon-controlled rectifier 20 and an ON/OFF controller 30 connected in series. The operation of the protection circuit according to the present invention will be described as follows.

The anode 10 of the silicon-controlled rectifier 20 is connected to the IC Pad 1. When ESD stress occurs at the IC pad 1, the ON/OFF controller 30 serves as a conduction path to connect the cathode of the silicon-controlled rectifier 20 with the grounding node $V_{SS}$. In other words, the cathode 11 of the silicon-controlled rectifier 20 is electrically coupled to the grounding node $V_{SS}$ by the ON/OFF controller 30. Accordingly, the induced ESD current conducts from the IC pad 1 to the grounding node $V_{SS}$ because the silicon-controlled rectifier 20 latches up, and therefore bypasses the ESD stress. When the integrated circuit device is intended to operate in normal mode, the ON/OFF controller 30 disconnects the silicon-controlled rectifier 20 from the grounding node $V_{SS}$. Therefore, even if noise interferes with the integrated circuit, the silicon-controlled rectifier 20 will not latch-up and disturb the normal operation of the integrated circuit.

EXAMPLE 1

Figure 4:
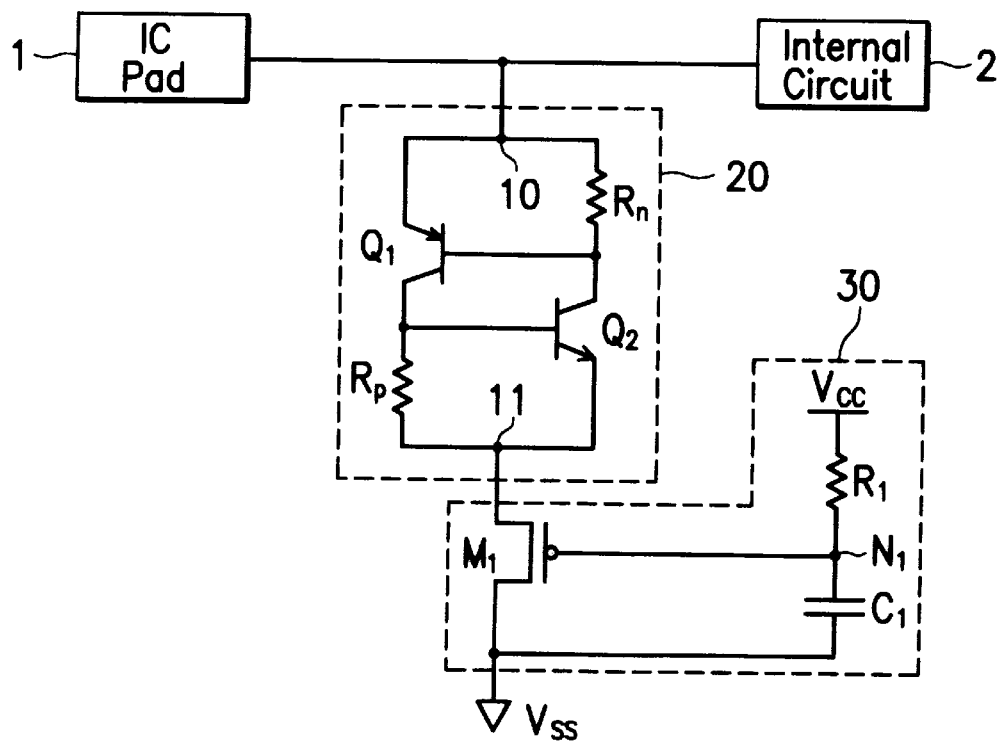
FIG. 4 schematically depicts the circuit diagram of a first example of the ON/OFF controller of FIG. 3.

As shown in FIG. 4, the circuit diagram of a first example of the ON/OFF controller 30 of FIG. 3 is schematically depicted. In this drawing, the ON/OFF controller 30 comprises a PMOS (the acronym for a P-type Metal-Oxide-Semiconductor) transistor $M_1$, a resistor $R_1$, and a capacitor $C_1$. The PMOS transistor $M_1$ is configured with its source and drain connected to the cathode 11 of the silicon-controlled rectifier 20 and the grounding node $V_{SS}$, respectively. The resistor $R_1$ has two terminals connected to a powering node $V_{CC}$ and the gate of the PMOS transistor $M_1$, respectively. The capacitor $C_1$ is connected between the grounding node $V_{SS}$ and the gate of the PMOS transistor $M_1$. Consequently, there is an intermediate node between the resistor $R_1$ and the capacitor $C_1$ designated as $N_1$. In this embodiment, the electrical potential of the node $N_1$ is substantially equal to that of the gate of the PMOS transistor $M_1$.

When ESD stress occurs at the IC pad 1, the powering node $V_{CC}$ is floating and therefore has an electric potential of about 0V, and the node $N_1$ is charged to the same voltage via the resistor $R_1$. Because both of the gate of the PMOS transistor $M_1$ and the node $N_1$ have the same electric potential, the PMOS transistor $M_1$ is turned on and thus serves as the conduction path between the silicon-controlled rectifier 20 and the grounding node $V_{SS}$. At that time, latch-up of the silicon-controlled rectifier 20 is triggered to conduct the resulting ESD current and, therefore, bypass the ESD stress. Accordingly, by conducting the ESD current through the silicon-controlled rectifier 20, the internal circuit 2 is protected from ESD damage.

During normal operation the powering node $V_{CC}$ is connected and powered with a voltage source (for example, 5V or 3.3V) to charge the node $N_1$ up to the electric potential with which the voltage source is provided through the resistor $R_1$ and the capacitor $C_1$. At that time, the PMOS transistor $M_1$ is turned off and thus disconnects the silicon-controlled rectifier 20 from the grounding node $V_{SS}$ to ensure that the integrated circuit operates normally.

Based upon the human body model, an ESD pulse has a duration width of about 150~300 ns; however, the duration to power the powering node $V_{CC}$ from 0V to full level generally requires 5~100 ms. Therefore, the RC time constant of the resistor $R_1$ and the capacitor $C_1$ should preferably range from about 200 ns to about 500 ns.

EXAMPLE 2

Figure 5:
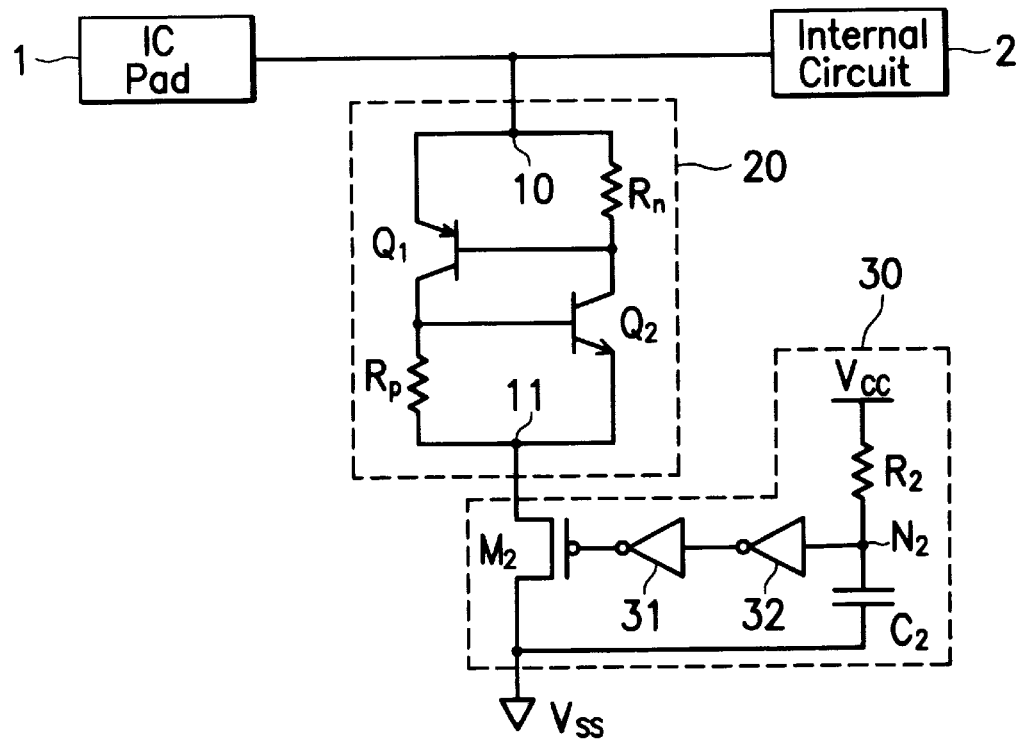
FIG. 5 schematically depicts the circuit diagram of a second example of the ON/OFF controller of FIG. 3.

As shown in FIG. 5, the circuit diagram of a second example of the ON/OFF controller 30 of FIG. 3 is schematically depicted. In this drawing, the ON/OFF controller 30 comprises a PMOS transistor $M_2$, a resistor $R_2$, a capacitor $C_2$, and two inverters 31 and 32. The PMOS transistor $M_2$ is configured with its source and drain connected to the cathode 11 of the silicon-controlled rectifier 20 and the grounding node $V_{SS}$, respectively. The resistor $R_2$ has one terminal connected to a powering node $V_{CC}$ and another terminal coupled to the gate of the PMOS transistor $M_2$ by the inverters 32 and 31, sequentially. The capacitor $C_2$ is configured connected between the grounding node $V_{SS}$ and the gate of the PMOS transistor $M_2$. Consequently, there is an intermediate node between the resistor $R_2$ and the capacitor $C_2$ designated as $N_2$. In this embodiment, the electric potential of the node $N_2$ is substantially equal to that of the gate of the PMOS transistor $M_2$.

When ESD stress occurs at the IC pad 1, the powering node $V_{CC}$ is floating and therefore has an electric potential of about 0V, whereas the node $N_2$ is charged to the same potential via the resistor $R_2$. Because both the gate of the PMOS transistor $M_2$ and the node $N_2$ have the same electric potential, the PMOS transistor $M_2$ is turned on and thus serves as the conduction path between the silicon-controlled rectifier 20 and the grounding node $V_{SS}$. At that time, latch-up of the silicon-controlled rectifier 20 is triggered to conduct the resulting ESD current and, therefore, bypass the ESD stress. Accordingly, the ESD current flowing through the silicon-controlled rectifier 20 protects the internal circuit 2 from ESD damage.

During normal operation the powering node $V_{CC}$ is connected and powered with a voltage source (for example, 5V or 3.3V) to charge the node $N_2$ to the electric potential with which the voltage source is provided through the resistor $R_2$ and the capacitor $C_2$. At that time, the PMOS transistor $M_2$ is turned off, disconnecting the silicon-controlled rectifier 20 from the grounding node $V_{SS}$ to ensure that the integrated circuit operates normally.

Based upon the human body model, an ESD pulse has a duration width of about 150~300 ns; however, the duration to power the powering node $V_{CC}$ from 0V to full level generally requires 5~100 ms. Therefore, the RC time constant of the resistor $R_2$ and the capacitor $C_2$ preferably ranges from about 200 ns to about 500 ns.

EXAMPLE 3

Figure 6:
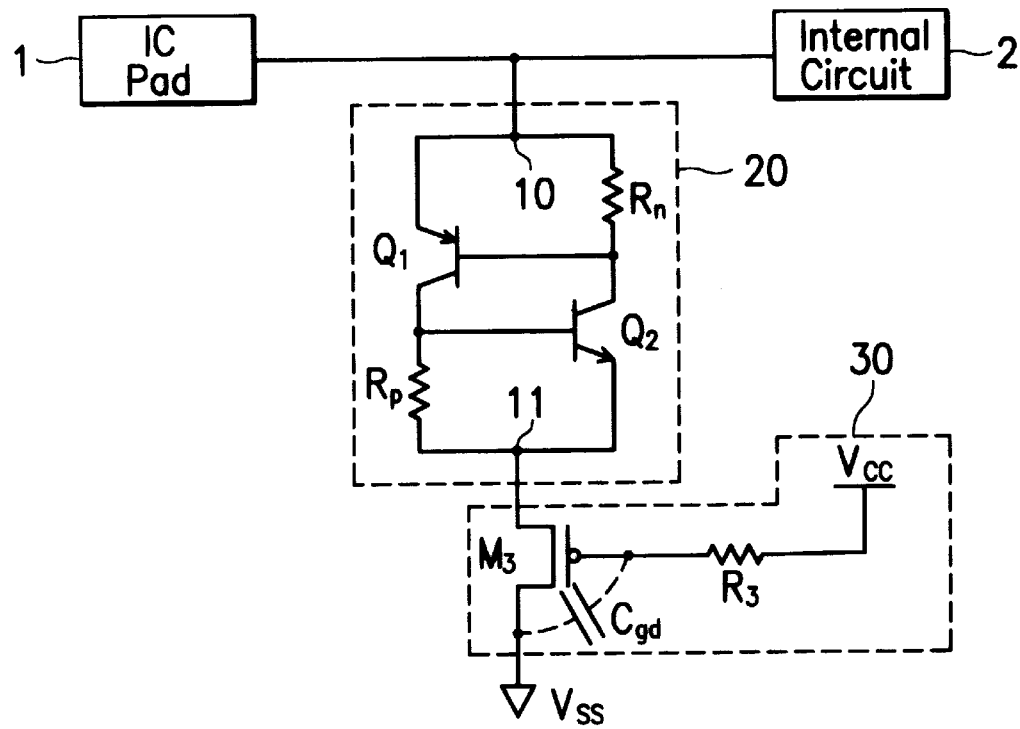
FIG. 6 schematically depicts the circuit diagram of a third example of the ON/OFF controller of FIG. 3.

As shown in FIG. 6, the circuit diagram of a third example of the ON/OFF controller 30 of FIG. 3 is schematically depicted. In this drawing, the ON/OFF controller 30 comprises a PMOS (the acronym for a P-type Metal-Oxide-Semiconductor) transistor $M_3$ and a resistor $R_3$. The PMOS transistor $M_3$ is configured with its source and drain connected to the cathode 11 of the silicon-controlled rectifier 20 and the grounding node $V_{SS}$. The resistor $R_3$ has two terminals connected to a powering node $V_{CC}$ and the gate of the PMOS transistor $M_3$, respectively.

When ESD stress occurs at the IC pad 1, the powering node $V_{CC}$ is floating, and therefore has an electric potential of about 0V, whereas the gate of the PMOS transistor $M_3$ is charged to the same voltage via the resistor $R_3$. Therefore, the PMOS transistor $M_3$ is turned on and thus serves as the conduction path between the silicon-controlled rectifier 20 and the grounding node $V_{SS}$. At that time, latch-up of the silicon-controlled rectifier 20 is triggered to conduct the resulting ESD current and, therefore, bypass the ESD stress. Accordingly, the ESD current flowing through the silicon-controlled rectifier 20 protects the internal circuit 2 from ESD damage.

During normal operation the powering node $V_{CC}$ is connected and powered with a voltage source (for example, 5V or 3.3V). Thus, the voltage source charges the gate of the PMOS transistor $M_3$ to the electric potential with which the voltage source is provided through the resistor $R_3$ and the junction capacitor $C_{gd}$ between the gate and the drain of the PMOS transistor $M_3$. At that time, the PMOS transistor $M_3$ is turned off and thus disconnects the silicon-controlled rectifier 20 from the grounding node $V_{SS}$ to ensure that the integrated circuit operates normally.

Based upon the human body model, an ESD pulse has a duration width of about 150~300 ns; however, the duration necessary to power the powering node $V_{CC}$ from 0V to full level generally requires 5~100 ms. Therefore, the RC time constant of the resistor $R_3$ and the junction capacitor $C_{gd}$ should preferably range from about 200 ns to about 500 ns.

In conclusion, the ESD protection circuit makes use of one silicon-controlled rectifier as the main component accompanying an ON/OFF controller. The ON/OFF controller and the silicon-controlled rectifier are connected in series between an IC pad and a grounding node. When ESD stresses occur at the IC pad, a conduction path is formed through the silicon-controlled rectifier and the ON/OFF controller from the IC pad and the grounding node. Latch-up of the silicon-controlled rectifier is triggered to conduct the ESD current and, therefore, bypass the ESD so as to protect the internal circuit 2 from ESD damage. During normal operation of the ESD protection circuit, the ON/OFF controller disconnects the conduction path to prevent the latch-up even if noise interference happens. Therefore, the ESD protection circuit is capable of ESD protection, and is immune to latch-up during normal operation.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention and practice various other embodiments and make various modifications suited to the particular use contemplated. It is intended that the scope of the invention be defined by the following claims and their equivalents.

What is claimed is:

1. An electrostatic discharge protection circuit to be positioned at an IC pad for preventing an internal circuit within an integrated circuit from ESD damage, the electrostatic discharge protection circuit comprising: a lateral silicon-controlled rectifier circuit coupled between said IC pad and a grounding node to provide electrostatic discharge through an ESD path; and an ON/OFF controller arranged in said conduction path; said ON/OFF controller disconnecting said ESD path during normal operation, said ON/OFF controller including:
a PMOS transistor having a source and a drain connected to a cathode of said silicon-controlled rectifier and said grounding node, respectively;
a resistor connected between a gate of said transistor and a powering node; and
a capacitor connected between said gate of said transistor and said grounding node.

2. The electrostatic discharge protection circuit as claimed in claim 1, wherein said resistor and capacitor have a time constant of about 200~500 ns.

3. The electrostatic discharge protection circuit as claimed in claim 1, wherein said ON/OFF controller comprises:
a PMOS transistor having a source and a drain connected to a cathode of said silicon-controlled rectifier and said grounding node, respectively;
two inverters connected in series;
a resistor having one terminal connected to a powering node and another terminal coupled to a gate of said PMOS transistor; and
a capacitor having one terminal connected to said grounding node and another terminal coupled to said gate of said PMOS transistor.

4. The electrostatic discharge protection circuit as claimed in claim 3, wherein said resistor and capacitor have a time constant of about 200~500 ns.

5. An electrostatic discharge protection circuit to be positioned at an IC pad for preventing an internal circuit within an integrated circuit from ESD damage, the electrostatic discharge protection circuit comprising:

a lateral silicon-controlled rectifier circuit coupled between said IC pad and a grounding node to provide electrostatic discharge through an ESD path; and an ON/OFF controller arranged in said ESD path; wherein said ON/OFF controller is connected in series to said silicon-controlled rectifier and disconnects said ESD path during normal operation, wherein said ON/OFF controller comprises:

a PMOS transistor having a source and a drain connected to a cathode of said silicon-controlled rectifier and said grounding node, respectively; and a resistor connected between a gate of said transistor and a powering node.

6. The electrostatic discharge protection circuit as claimed in claim 5, wherein said PMOS transistor has a junction capacitor between said gate and drain.

7. The electrostatic discharge protection circuit as claimed in claim 6, wherein said resistor and said junction capacitor have a time constant of about 200~500 ns.

8. The electrostatic discharge protection circuit as claimed in claim 5, wherein said ON/OFF controller comprises a capacitor connected between said gate of said transistor and said grounding node.

9. The electrostatic discharge protection circuit as claimed in claim 8, wherein said resistor and capacitor have a time constant of about 200~500 ns.

10. An electrostatic discharge protection circuit to be positioned at an IC pad for protecting an internal circuit within an integrated circuit from ESD damage, said electrostatic discharge protection circuit comprising:

a lateral silicon-controlled rectifier circuit for providing electrostatic discharge, said rectifier circuit having an anode connected to said IC pad; a PMOS transistor having a source and a drain connected to a cathode of said silicon-controlled rectifier and a grounding node, respectively;

a resistor connected between a gate of said transistor and a powering node; and a capacitor connected between said gate of said transistor and said grounding node.

11. The electrostatic discharge protection circuit as claimed in claim 10, wherein said resistor and said capacitor have a time constant of about 200~500 ns.

* * * * *